United States Patent
Sung

(10) Patent No.: US 8,357,969 B2
(45) Date of Patent: Jan. 22, 2013

(54) SEMICONDUCTOR DEVICE HAVING VERTICAL CHANNEL TRANSISTOR AND MANUFACTURING METHOD OF THE SAME

(75) Inventor: Min Chul Sung, Seoul (KR)

(73) Assignee: Hynix Semiconductor Inc, Icheon-Si (KR)

( * ) Notice: Subject to any disclaimer, the term of this patent is extended or adjusted under 35 U.S.C. 154(b) by 626 days.

(21) Appl. No.: 12/495,719

(22) Filed: Jun. 30, 2009

(65) Prior Publication Data

US 2010/0301407 A1    Dec. 2, 2010

(30) Foreign Application Priority Data

May 28, 2009  (KR) ........................ 10-2009-0046864

(51) Int. Cl.
    *H01L 29/78* (2006.01)
(52) U.S. Cl. ................................ 257/329; 257/E29.257
(58) Field of Classification Search .................. None
    See application file for complete search history.

(56) References Cited

U.S. PATENT DOCUMENTS

| | | | |
|---|---|---|---|
| 6,800,898 B2 | 10/2004 | Cappelani et al. | |
| 7,285,812 B2 | 10/2007 | Tang et al. | |
| 7,838,925 B2 * | 11/2010 | Roesner et al. | 257/328 |
| 7,846,796 B2 * | 12/2010 | Yun et al. | 438/262 |
| 7,851,842 B2 * | 12/2010 | Cho | 257/302 |
| 2002/0066925 A1 | 6/2002 | Gruening et al. | |
| 2006/0113587 A1 * | 6/2006 | Thies et al. | 257/328 |
| 2006/0216870 A1 | 9/2006 | Noble, Jr. et al. | |
| 2006/0258084 A1 | 11/2006 | Tang et al. | |
| 2007/0210374 A1 * | 9/2007 | Wu | 257/329 |
| 2009/0242972 A1 * | 10/2009 | Cho | 257/329 |
| 2010/0013005 A1 * | 1/2010 | Roesner et al. | 257/329 |
| 2011/0180910 A1 * | 7/2011 | Kim | 257/623 |
| 2011/0189843 A1 * | 8/2011 | Lee et al. | 438/513 |
| 2011/0269279 A1 * | 11/2011 | Lee | 438/270 |
| 2011/0298046 A1 * | 12/2011 | Hong | 257/331 |

* cited by examiner

Primary Examiner — Benjamin Sandvik

(57) ABSTRACT

A semiconductor device having a vertical channel transistor and a method for manufacturing the same are provided. In the semiconductor device, a metal bit line is formed between vertical channel transistors, and the metal bit line is connected to only one of the vertical channel transistors through an asymmetric bit line contact. Through such a structure, the resistance of the bit line can be improved and the process margin for formation of the bit line can be secured.

6 Claims, 7 Drawing Sheets

SEMICONDUCTOR DEVICE HAVING VERTICAL CHANNEL TRANSISTOR AND MANUFACTURING METHOD OF THE SAME

CROSS-REFERENCE TO RELATED APPLICATION

The priority of Korean patent application No. 10-2009-0046864 filed on May 28, 2009, the disclosure of which is hereby incorporated in its entirety by reference, is claimed.

BACKGROUND OF THE INVENTION

The present invention relates to a semiconductor device having a vertical channel transistor, and more particularly, to a semiconductor device which is capable of using an entire space (width) between vertical channel transistors as a bit line region, without separating the space.

As the integration of semiconductor devices has increased, the channel length of transistors has gradually shrunk. The reduction of the channel length causes a short channel effect, such as a drain induced barrier lowering (DIBL), a hot carrier effect, and a punch through.

To solve those shortcomings, various methods have been proposed. One exemplary method is to reduce a depth of a junction region or to increase a channel length by forming a recess channel for a transistor.

However, as the integration of semiconductor devices reaches Giga bits level, a general planar transistor structure having junction regions at both sides of a gate electrode has a difficulty in meeting a required device area even though a channel length is scaled down.

To solve the above-described limitations, a vertical channel transistor has been proposed.

A vertical channel transistor includes a gate and a buried bit line. The gate is formed to surround a vertical channel structure.

A general method for manufacturing a vertical channel transistor will be described below.

A photo process is performed to etch a cell region of a semiconductor substrate to a predetermined depth, thereby obtaining a top pillar, and a spacer surrounding a sidewall of the top pillar. Using the spacer as an etch mask, the exposed semiconductor substrate is further etched to form a trench, and an isotropic wet etch process is performed on the trench to form a neck pillar that integrally extends from the top pillar along a vertical direction. The neck pillar is formed to have a narrower width than the top pillar.

A surrounding gate including a gate insulating film and a gate conductive film is formed at an outer sidewall of the neck pillar. Then impurity ions are implanted into the semiconductor substrate adjacent to the surrounding gate, thereby obtaining a bit line impurity region. The semiconductor substrate is etched to a predetermined depth at which the impurity region is separated, thereby obtaining buried bit lines where the impurity region is separated. To prevent the buried bit lines from being electrically shorted, the semiconductor substrate is etched relatively deep.

Known subsequent processes are performed in sequence to complete the fabrication of a semiconductor device having a vertical channel transistor.

However, the method of separating the buried bit lines by etching the semiconductor substrate has a difficulty in securing a dimension necessary for processes, since a critical dimension of the buried bit lines is getting smaller because of higher integration of semiconductor devices.

Moreover, if a high-concentration ion implantation process is performed directly on a silicon substrate to form the buried bit lines, diffusion of impurities causes a body floating phenomenon. This results in degradation in performance of the transistor. On the other hand, if a doping concentration in the ion implantation process decreases, bit line resistance increases.

BRIEF SUMMARY OF THE INVENTION

Various embodiments of the invention are directed to provide a semiconductor device having a vertical channel transistor, which is capable of reducing a resistance of a bit line and ensuring a process margin even though a design rule is reduced.

According to an embodiment of the present invention, a semiconductor device having a vertical channel transistor includes: a first pillar and a second pillar each having a junction region at a lower portion thereof; a bit line buried between the first pillar and the second pillar; and an asymmetric bit line contact contacting the junction region of the first pillar to the bit line.

Since the bit line is formed by using an entire space between the vertical channel transistors, the resistance of the bit line can be improved and the process margin for formation of the bit line can be sufficiently secured.

The bit line may include a first metal film, and a second metal film coated on a bottom surface and a side of the first metal film. The first metal film and the second metal film may include a tungsten film and a titanium nitride film, respectively.

The asymmetric bit line contact connects one side of the metal bit line to the junction region of the first pillar. That is, the asymmetric bit line contact is formed to contact the side of the metal bit line by forming the metal bit line as high as the asymmetric bit line contact in a space between the vertical channel transistors. The asymmetric bit line contact may include one of a cobalt silicide (CoSix) film, a titanium silicide ($TiSi_x$) film, a tungsten silicide ($WSi_x$) film, and a nickel silicide ($NiSi_x$) film.

The semiconductor device may further include an insulating film between the other side of the metal bit line and the junction region of the second pillar. In addition, the semiconductor device may further include a separation oxide film coated on a lower portion of the metal bit line and separating the junction region of the first pillar from the junction region of the second pillar. Moreover, the semiconductor device may further include a buffer oxide film coated on sides of the first pillar and the second pillar.

According to another embodiment of the present invention, a method for manufacturing a semiconductor device includes: etching a silicon substrate to form a first pillar and a second pillar separated from each other by a predetermined interval; forming junction regions under the first pillar and the second pillar; forming a bit line contact at a sidewall of the junction region of the first pillar, and forming an insulating film at a sidewall of the junction region of the second pillar; and forming a bit line contacting the bit line contact in a space between the bit line contact and the insulating film.

The etching-a-silicon-substrate-to-form-a-first-pillar-and-a-second-pillar may include forming a buffer oxide film at sidewalls of the first pillar and the second pillar and over the silicon substrate between the first pillar and the second pillar.

The forming-junction-regions-under-the-first-pillar-and-the-second-pillar may include: forming an impurity region by implanting first impurities into the silicon substrate between the first pillar and the second pillar; etching the impurity region to a predetermined depth to form a first trench, and forming a spacer nitride film inside the first trench and over the first pillar and the second pillar; and etching a lower portion of the first trench to form a second trench separating the impurity region formed under the first pillar and the impurity region formed under the second pillar. The forming-junction-regions-under-the-first-pillar-and-the-second-pillar may include oxidizing the silicon substrate exposed by the second trench to form a separation oxide film.

The forming-junction-regions-under-the-first-pillar-and-the-second-pillar may include: forming an impurity region by implanting first impurities into the silicon substrate between the first pillar and the second pillar; etching the impurity region to a predetermined depth to form a first trench, and forming a spacer nitride film inside the first trench and over the first pillar and the second pillar; etching a lower portion of the first trench to form a second trench; and implanting impurities having a conductivity type opposite to the impurity region into a lower portion of the second trench.

The forming-a-bit-line-contact and forming-an-insulating-film may include: implanting second impurities into only the spacer nitride film formed at the sidewall of the first pillar of the first and second pillars facing each other, with the bit line being interposed therebetween; selectively removing the spacer nitride film into which the second impurities are implanted; forming a first metal film at the sidewall of the first pillar, and performing a thermal treatment on the first metal film; and selectively removing the first metal film so that only a portion of the first metal film silicided by the thermal treatment remains. At this point, the second impurities may be implanted into the spacer nitride film by a tilted ion implantation of boron ions (BF2), and the first metal film may include a cobalt (Co) film.

The forming-a-bit-line-contact and forming-an-insulating-film may include: filling a space between the first pillar and the second pillar with polysilicon; etching the polysilicon to expose only the spacer nitride film formed at the sidewall of the first pillar of the first and second pillars facing each other, with the bit line being interposed therebetween; removing the exposed spacer nitride film; and removing the polysilicon. The spacer nitride film may be removed by a cleaning process using phosphoric acid.

The forming-a-bit-line may include: forming a second metal film in a space between the bit line contact and the insulating film so that the second metal film contacts the bit line contact; and forming a third metal film to bury the second metal line. The second metal film may include a titanium nitride (TiN) film, and the third metal film may include a tungsten (W) film.

DESCRIPTION OF EMBODIMENTS

Embodiments of the present invention will be described below in detail with reference to the accompanying drawings.

Figure 1:
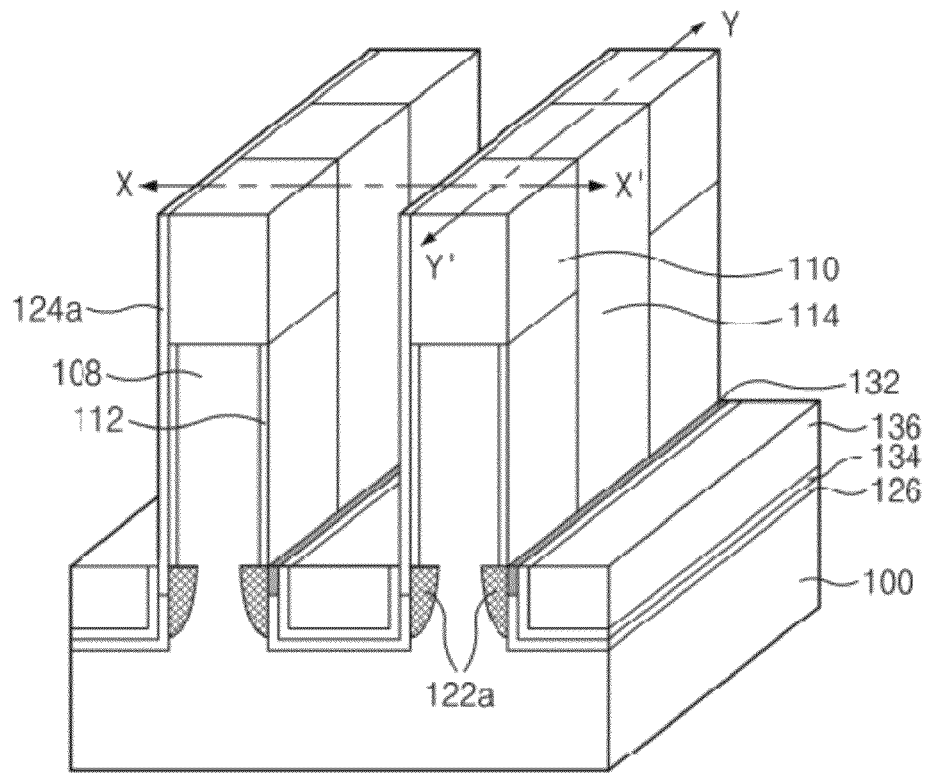
FIG. 1 is a perspective view of a semiconductor device having a vertical channel transistor according to an embodiment of the present invention.
Figure 2:
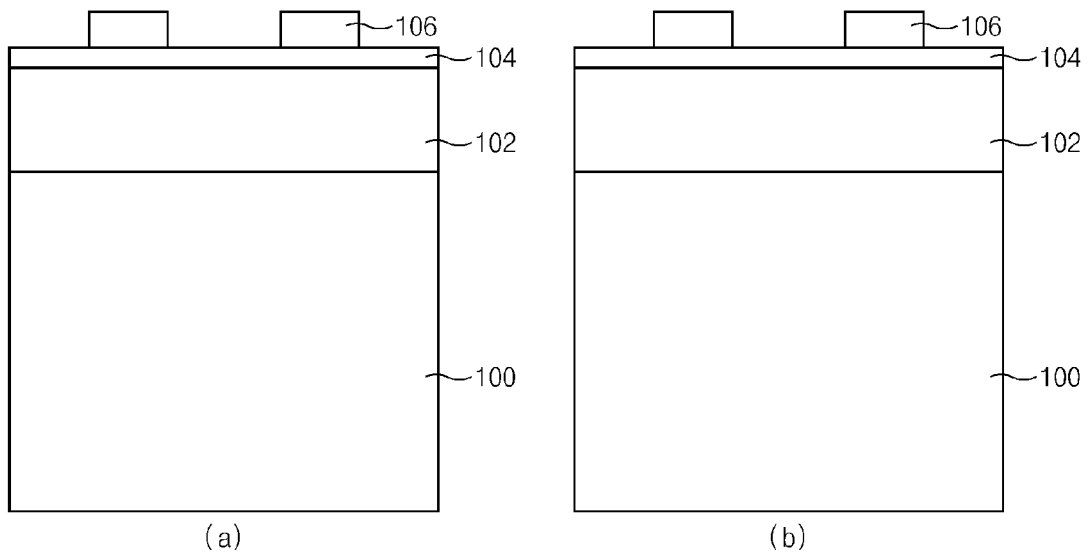
FIGS. 2 to 13 are cross-sectional views illustrating a method for manufacturing the semiconductor device of FIG. 1.
Figure 3:
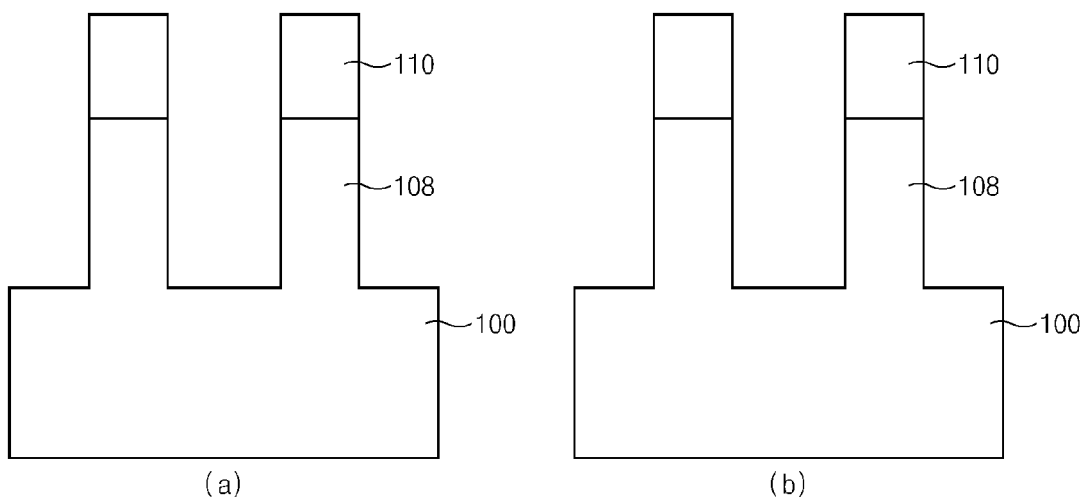
Figure 4:
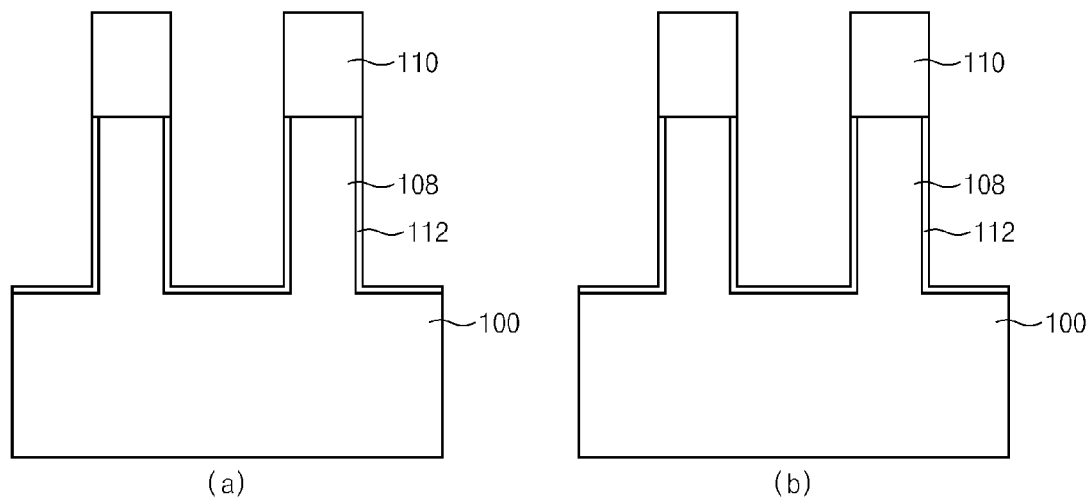
Figure 5:
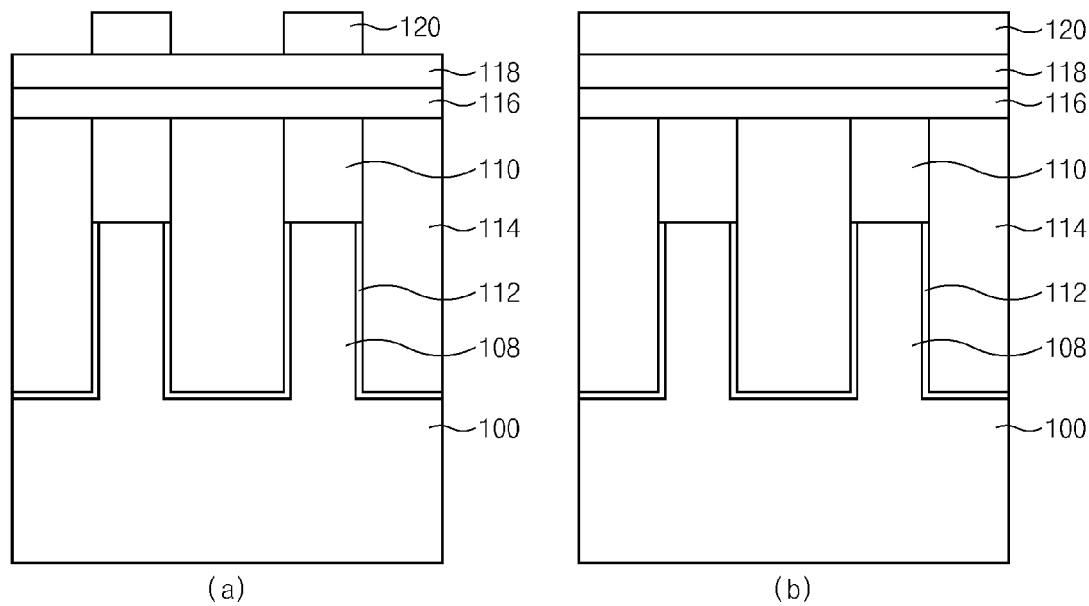
Figure 6:
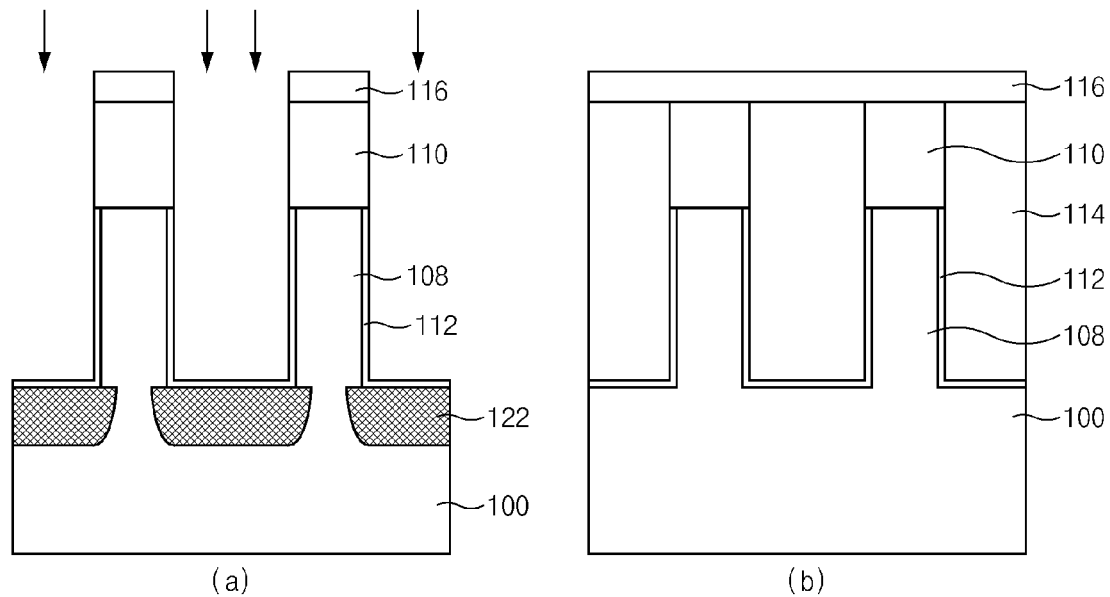
Figure 7:
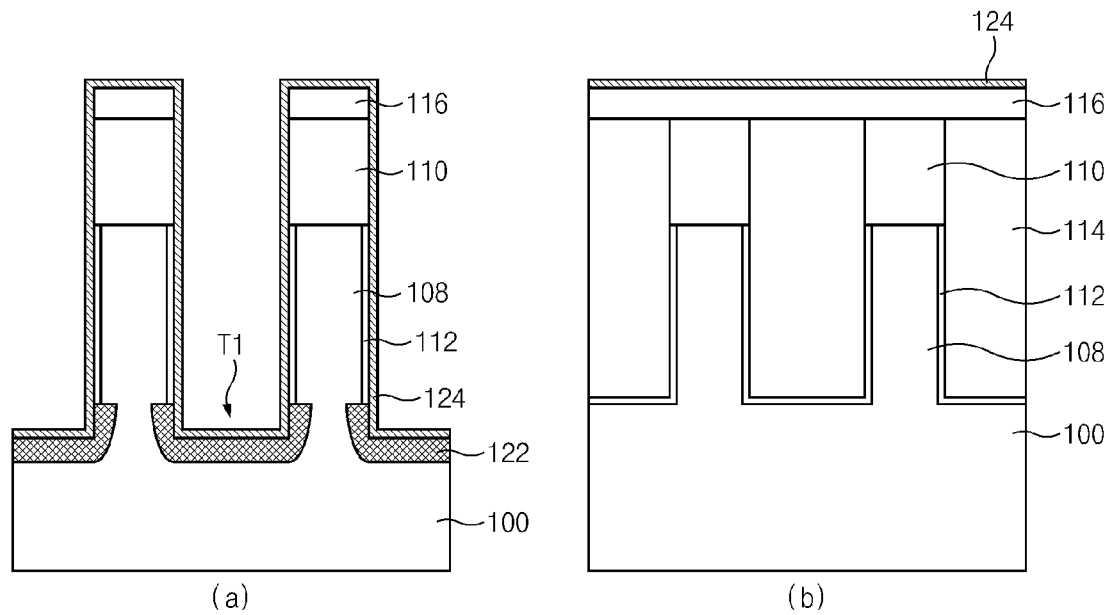

FIG. 1 is a perspective view of a semiconductor device having a vertical channel transistor according to an embodiment of the present invention.

Referring to FIG. 1, a hard mask pattern 110 is formed over a pillar 108 that is obtained by etching a silicon substrate 100. A buffer oxide film 112 is formed at a sidewall of the pillar 108. Junction regions 122a doped with impurity ions are formed in the silicon substrate 100 under the pillar 108. A titanium nitride film 134 is formed over a separation oxide film 126, and a tungsten film 136 is formed over the titanium nitride film 134. According to an embodiment of the present invention, the titanium nitride film 134 and the tungsten film 136 form a metal bit line. The bit line may be formed as high as the junction region 122a. The separation oxide film 126 separates the metal bit line from the silicon substrate 100.

An asymmetric bit line contact 132 is finned between the titanium nitride film 134 and one of the junction regions 122a formed at one side of the metal bit line 134 and 136. That is, the asymmetric bit line contact 132 connects the metal bit line to one of the vertical channel transistors disposed at both sides of the metal bit line. The other junction region 122a is separated from the metal bit line by a gate spacer film 124a, e.g., a nitride film. The asymmetric bit line contact 132 may include a cobalt silicide ($CoSi_x$) film formed by oxidizing a cobalt film contacting the silicon substrate 100, and the asymmetric bit line contact 132 may have a thickness of approximately 10 Å to approximately 100 Å.

An interlayer insulating film 114 is formed between the pillars arranged in parallel to the metal bit line.

FIGS. 2 to 13 are cross-sectional views illustrating a method for manufacturing the semiconductor device of FIG. 1. Specifically, FIGS. 2a, 3a, . . . , and 13a are cross-sectional views taken along line X-X' of FIG. 1, and FIGS. 2b, 3b, . . . , and 13b are cross-sectional views taken along line Y-Y' of FIG. 1.

Referring to FIGS. 2a and 2b, a pad oxide film (not shown) is formed over a silicon substrate 100, and a hard mask film 102 is formed over the pad oxide film. The hard mask film 102 may include one of a nitride film (for example, $Si_3N_4$), an oxide film, and a stacked structure thereof.

An antireflective film 104 and a photoresist film (not shown) are formed over the hard mask film 102. An exposure process is performed on the photoresist film by using a mask (not shown) defining a pillar, and a development process is performed on the exposed photoresist film to form photoresist patterns 106.

Referring to FIGS. 3a and 3b, the antireflective film 104, the hard mask film 102 and the silicon substrate 100 are sequentially etched by using the photoresist patterns 106 as an etch mask. This obtains pillar 108 formed along the direction vertical to the surface of the silicon substrate 100. The photoresist patterns 106 and the antireflective film 104 are removed. The hard mask patterns 110 remain over the pillar 108. If the photoresist patterns 106 and the antireflective film 104 remain, they can be removed by an additional etch process. If the hard mask film 102 has a stacked structure of a nitride film and an oxide film, the oxide film is removed, leaving the nitride film over the pillar 108.

Referring to FIGS. 4a and 4b, the exposed silicon substrate 100 is oxidized to form a buffer oxide film 112 on the surface of the silicon substrate 100 and at sidewalls of the pillar 108. The buffer oxide film 112 may include a silicon oxide ($SiO_2$) film.

Referring to FIGS. 5a and 5b, an interlayer insulating film 114 is formed over the buffer oxide film 112 and the hard mask patterns 110, and the interlayer insulating film 114 is etched and planarized until the top surface of the hard mask pattern 110 is exposed.

An oxide film 116, an antireflective film 118 and a photoresist film (not shown) are sequentially formed over the interlayer insulating film 114 and the hard mask pattern 110. An exposure process is performed on the photoresist film by using a bit line mask (not shown) to define a bit line region. A development process is performed on the photoresist film to form photoresist patterns 120.

Referring to FIGS. 6a and 6b, the antireflective film 118, the oxide film 116 and the interlayer insulating film 114 are sequentially etched by using the photoresist patterns 120 as an etch mask. The photoresist patterns 120 and the antireflective film 118 are removed. If the photoresist patterns 120 and the antireflective film 118 remain, they can be removed by an additional etch process.

Impurities are implanted into the silicon substrate 100 to form an impurity region 122.

Referring to FIGS. 7a and 7b, the buffer oxide film 112 formed on the silicon substrate 100, e.g., the surface between the pillars, is removed by using the oxide film 116 formed over the pillar 108 as an etch mask. The exposed silicon substrate 100 is etched to a predetermined depth to form a trench T1 in the impurity region 122.

A gate spacer film 124 is formed over a resulting structure. The gate spacer film 124 may include a silicon nitride film.

Referring to FIGS. 8a and 8b, the gate spacer film 124 formed on the bottom surface of the trench T1 is removed to form a first gate spacer pattern 124a. The trench T1 is additionally etched using the first gate spacer pattern 124a as a mask until the silicon substrate 100 is etch to or below the bottom of the impurity region 122 to form a trench T2. The trench T2 exposes the silicon substrate 100 that is not doped and separates each impurity region 122 into two junction regions 122a, one on a lower side of each pillar. The trench T2 secures a space for a metal bit line in a subsequent process.

The silicon substrate 100 exposed by the trench T2 is oxidized to form a separation oxide film 126. The separation oxide film 126 is an insulating film for electrically separating a metal bit line which is to be formed in the trench T2 in the subsequent process from the silicon substrate 100. In this embodiment, the separation oxide film 126 is formed by oxidizing the exposed silicon substrate 100, but it may also be formed by filling the trench T2 with insulating material. The two junction regions 122a are provided on two ends of the separation oxide film 126, one on each end.

Figure 8:
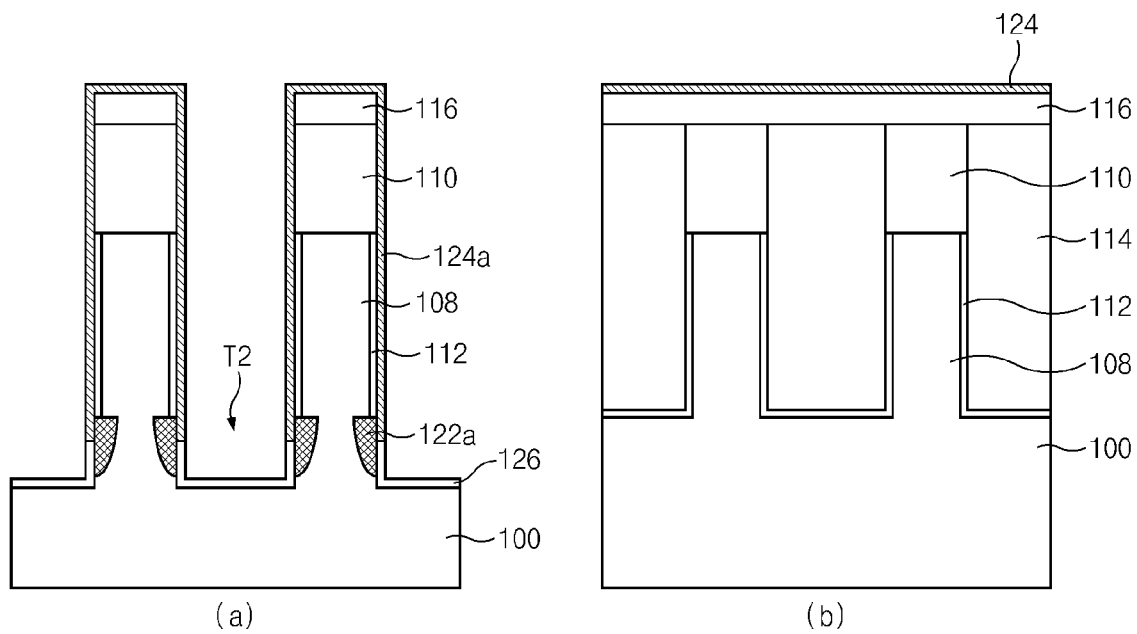
Figure 9:
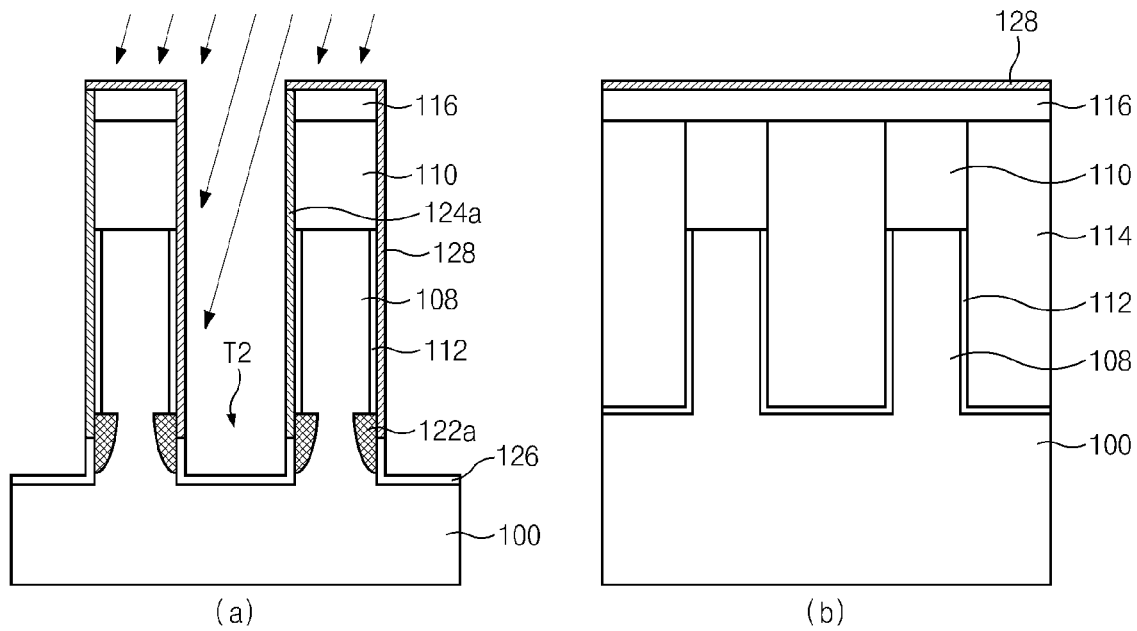

Referring to FIGS. 9a and 9b, a tilted ion implantation using boron ions ($BF_2$) is performed on a resulting structure of FIG. 8. The ions are implanted on one side of the pillar so that the first gate spacer pattern 124a of nitride (SiN) film formed on one side of the pillar is changed to a silicon boron nitride (SiBN) film or a second spacer pattern 128. The first gate spacer pattern 124a on the other side of the pillar receives little ions and remains as the first gate spacer pattern 124a of SiN film.

Referring to FIGS. 10a and 10b, a cleaning process is performed using a hydrofluoric acid (HF) or a hydroxide solution (ammonia or the like) to selectively remove the second gate spacer pattern 128 is removed. In the present embodiment, at least part of the junction region 122a is exposed when the second gate spacer 128 is removed. The first gate spacer pattern 124a on the other side of the pillar that has not been converted to SiBN remains on the pillar. A cobalt (Co) film 130 is formed over a resulting structure. The cobalt (Co) film is formed to a thickness of approximately 10 Å to approximately 100 Å.

Figure 10:
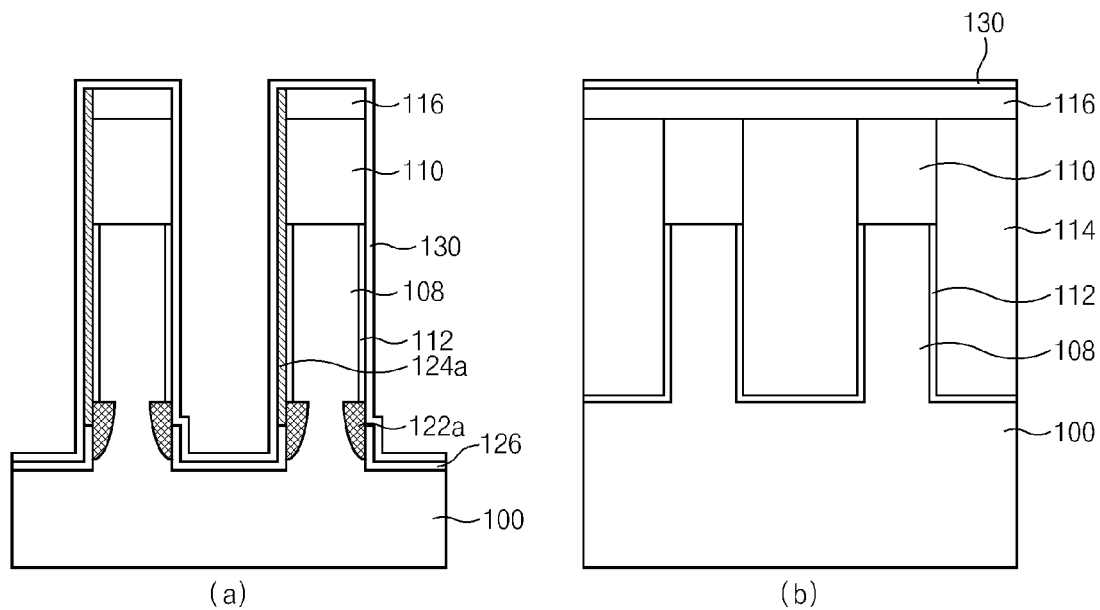
Figure 11:
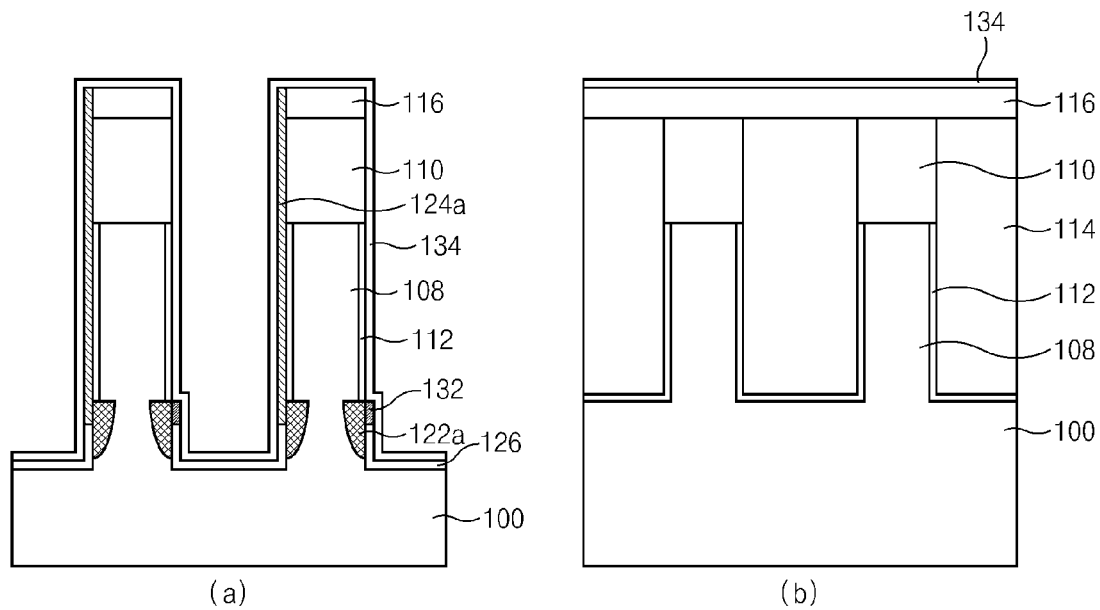

Referring to FIGS. 11a and 11b, a thermal treatment is performed on a resulting structure of FIG. 10, so that the cobalt (Co) film 130 contacting the silicon substrate 100 is changed to a cobalt silicide ($CoSi_x$) film 132. That is, through the thermal treatment on the cobalt (Co) film 130, a portion of cobalt (Co) film 130 contacting the exposed junction region 122a is changed to the cobalt silicide film (or an asymmetric bit line contact) 132. The asymmetric bit line contact 132 connects the junction region 122a serving as a drain region of the vertical channel transistor to a metal bit line which will be formed in a subsequent process.

In another embodiment a titanium silicide ($TiSi_x$) film, a tungsten silicide ($WSi_x$) film, or a nickel silicide ($NiSi_x$) film may also be used as an asymmetric bit line contact 132.

A cleaning process is performed to selectively remove the cobalt film 130 so that only the cobalt silicide film 132 remains. A titanium nitride (TiN) film 134 is formed over a resulting structure.

Referring to FIGS. 12a and 12b, a tungsten (W) film 136 is formed over the titanium nitride film 134, and it is etched and planarized until the titanium nitride film 134 is exposed.

Figure 12:
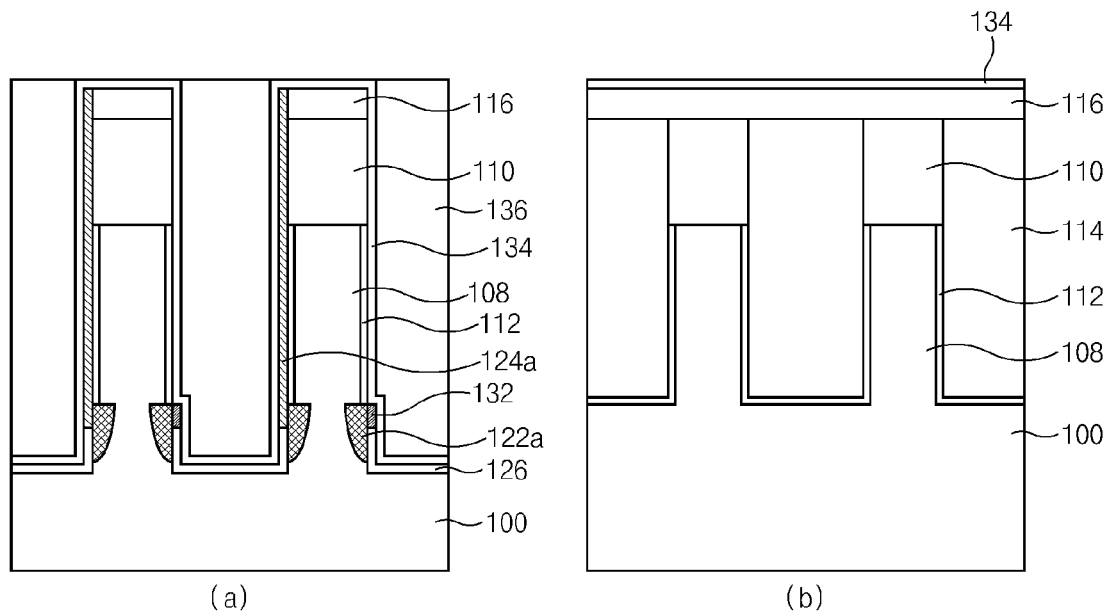
Figure 13:
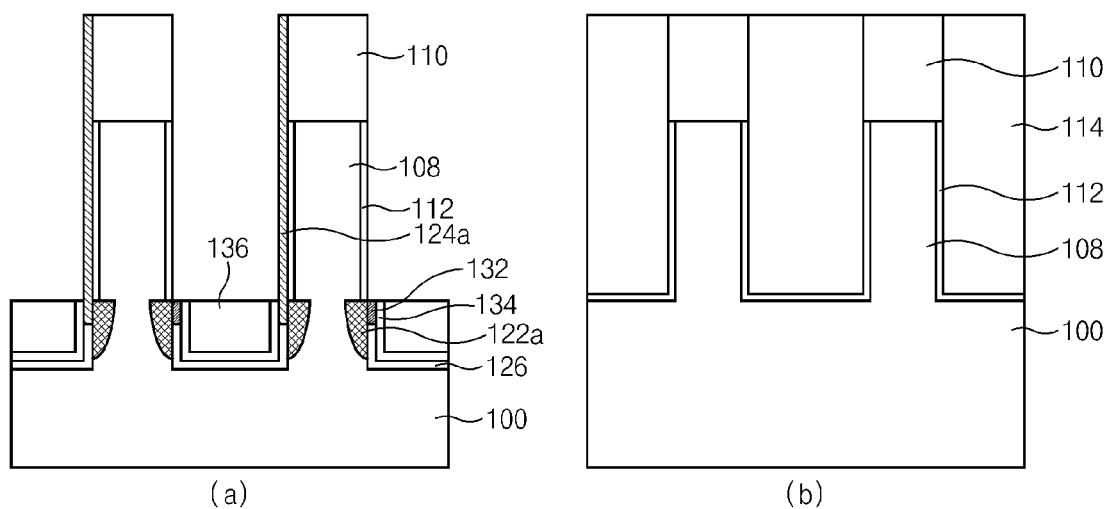

Referring to FIGS. 13a and 13b, an etch-back process is performed on the tungsten film 136 in a resulting structure of FIG. 12. The tungsten film 136 and the cobalt silicide film 132 (i.e., the bit line contact) have made to have about the same height. During the etch-back process, the exposed titanium nitride film 134 is also removed. Therefore, the titanium nitride film 134 and the tungsten film 136 are made to have about the same height as the bit line contact. The tungsten film 136 is formed within a space defined by the titanium nitride film 134. The titanium nitride film 134 and the tungsten film 136 remaining through the etch-back process form a metal bit line of the present invention.

If the tungsten film 136 is formed directly on the separation oxide film 126, adhesiveness becomes poor and thus lifting may occur. For this reason, in this embodiment, the titanium nitride film 134 is formed before the tungsten film 136.

After forming an interlayer insulating film (not shown) over the metal bit line 134 and 136, a surrounding gate and a word line connecting a plurality of the surrounding gates may be formed of a conductive material. Various well-known methods may be used to form the surrounding gate and the word line.

As described above, the bit line is formed in a buried form in a region between the vertical channel, and the bit line is connected to only one of the vertical channel transistors through the asymmetric bit line contact. As a result, the entire length between the vertical channel transistors can be used as the bit line region. Also, since the bit line is formed of a metal, the resistance of the bit line can be reduced and the process margin can be improved.

That is, according to the conventional art, since the buried bit lines are formed through separation of impurity regions between the vertical channel transistors. It is difficult to separate the impurity region when the semiconductor device is highly integrated. However, according to the embodiment of the present invention, when forming the bit lines, the separating process is not necessary and thus a sufficient process margin can be secured.

In the semiconductor device having the vertical channel transistor according to the embodiments of the present invention, the metal bit line is formed between the vertical channel transistors, and the metal bit line is connected to either of the vertical channel transistors disposed at its two sides. This improves the resistance of the bit line and secures the process margin for formation of the bit line.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

For example, in the above-described embodiments of the present invention, the trench T2 is etched deep enough to separate the impurity region 122 between the pillars. However, without etching the trench T2 deep, the impurity region 122 may also be separated by implanting impurities (for example, P-type impurities such as boron) having an opposite conductivity type to the impurity region 122 formed under the trench T2. That is, it is possible to prevent N-type impurities from penetrating other regions by implanting P-type impurities into a region between the N-type impurity regions 122.

Moreover, in the above-described embodiments of the present invention, the tilted ion implantation of boron ions is performed on the gate spacer nitride film 124 in order to expose only the impurity region defined in one of the two sidewalls facing each other, with the bit line 136 being interposed therebetween. However, instead of the tilted ion implantation, a mask may also be used.

For example, after burying polysilicon (not shown) over the resulting structure of FIG. 8, the polysilicon is selectively etched to a predetermined depth, so that only one of the two sidewalls facing each other is exposed. At this point, the polysilicon is etched to a predetermined depth at which the impurity region where the asymmetric bit line contact will be formed is exposed. The exposed gate spacer nitride film 124 is selectively removed by a cleaning process using phosphoric acid or the like. A wet cleaning process using an etch selectivity of the poly, oxide film 126 and the nitride film 124 is performed to selectively remove only the poly, thereby obtaining the same result as the above-described tilted ion implantation method.

Moreover, although the bit line is formed by burying the metal in the above-described embodiments, it may also be formed by burying N+ doped poly. For example, the bit line may be formed by burying polysilicon between the pillars in such a state that the impurity region 122 is exposed through the above-described tilted ion implantation and cleaning processes. In this way, if the bit line is formed by burying polysilicon, it is unnecessary to form a contact between the exposed impurity region 122 and the polysilicon, and thus, the above-described cobalt silicide film 132 need not be formed.

What is claimed is:

1. A semiconductor device having a vertical channel transistor, the semiconductor device comprising:
    a first pillar and a second pillar each having a first and a second sidewall and a junction region provided at a lower portion of each of the first and second pillars;
    a bit line buried between the first pillar and the second pillar;
    an asymmetric bit line contact coupling the junction region of the first pillar to the bit line;
    a buffer film provided over the first and second sidewalls of the first and second pillars; and
    a spacer provided over the buffer film of the first sidewall of the first pillar and the buffer film of the first sidewall of the second pillar,
    wherein the spacer extends below an upper surface of the junction region of the second pillar so that the spacer is disposed between the bit line and the junction region of the second pillar.

2. The semiconductor device according to claim 1, wherein the bit line comprises:
    a first metal film coupled to the asymmetric bit line contact; and
    a second metal film disposed over a bottom surface and a side of the first metal film.

3. The semiconductor device according to claim 1, wherein the asymmetric bit line contact couples a first side of the bit line to the junction region of the first pillar, the first side of the bit line being adjacent to the second sidewall of the first pillar.

4. The semiconductor device according to claim 3, wherein the asymmetric bit line contact comprises one of a cobalt silicide ($CoSi_x$) film, a titanium silicide ($TiSi_x$) film, a tungsten silicide ($WSi_x$) film, and a nickel silicide ($NiSi_x$) film.

5. The semiconductor device according to claim 3, further comprising an insulating film disposed between a second side of the bit line and the junction region of the second pillar.

6. The semiconductor device according to claim 1, wherein a lower surface of the spacer abuts an upper surface of an insulating film.

* * * * *